United States Patent [19]

Onodera et al.

[11] Patent Number: 5,391,900
[45] Date of Patent: Feb. 21, 1995

[54] INTEGRATED CIRCUIT HAVING POWER TRUNK LINE AND METHOD FOR LAYOUT OF POWER TRUNK LINE

[75] Inventors: Yuichi Onodera; Toshihiro Okabe; Yasuhiro Matsuura; Munehiro Sasakawa, all of Hadano, Japan

[73] Assignees: Hitachi, Ltd., Tokyo; Hitachi Computer Electronics Co., Ltd., Hadano, both of Japan

[21] Appl. No.: 994,056

[22] Filed: Dec. 18, 1992

Related U.S. Application Data

[63] Continuation of Ser. No. 647,488, Jan. 29, 1991, abandoned.

[30] Foreign Application Priority Data

Jan. 30, 1990 [JP] Japan .................................. 2-20123

[51] Int. Cl.⁶ ...................... H01L 27/02; H01L 27/10
[52] U.S. Cl. .................... 257/207; 257/202; 257/211; 437/180; 326/101
[58] Field of Search ............... 357/45; 257/207, 202, 257/211; 307/465.1, 482.1; 437/180, 182

[56] References Cited

U.S. PATENT DOCUMENTS

| | | | |
|---|---|---|---|
| 4,625,227 | 11/1986 | Hara et al. | 257/775 |
| 4,811,073 | 3/1989 | Kitamura et al. | 357/40 |
| 4,947,229 | 8/1990 | Tanaka et al. | 257/211 |
| 5,008,728 | 4/1991 | Yamamura et al. | 357/45 |

FOREIGN PATENT DOCUMENTS

| | | | |
|---|---|---|---|
| 112894B1 | 7/1984 | European Pat. Off. | H01L 23/48 |
| 307722A1 | 3/1989 | European Pat. Off. | H01L 23/52 |
| 2-30174 | 1/1990 | Japan | 257/202 |

OTHER PUBLICATIONS

"A 400K-Transistor CMOS Sea-of-Gates Array with Continuous Track Allocation", *IEEE Journal of Solid-State Circuits*, vol. 24, No. 5, Oct. 1989, pp. 1280–1286 Masatomi Okabe et al.

*Primary Examiner*—J. Carroll
*Attorney, Agent, or Firm*—Kenyon & Kenyon

[57] ABSTRACT

The present invention relates to an integrated circuit comprising a semiconductor chip having thereon a logical function portion for realizing logical function and at least one power supply point for supplying electric power to the logical function portion, and at least one first, second and third power trunk line are arranged on the chip for supplying electric power from the power supply point to the logical function portion. The second power trunk line is disposed in an area in which the logical function portion of the chip is disposed. The first power trunk line is disposed between the power supply point and the second power trunk line to connect the second power trunk line with the power supply point. The third trunk line is connected at at least one end to the second trunk line and is disposed in the logical function portion for supplying electric power to the logical function portion.

15 Claims, 4 Drawing Sheets

| PROCESS 1 | CREATE 1ST POWER TRUNK LINE DATA, AND STORE IT IN DATABASE |
| PROCESS 2 | CREATE 2ND POWER TRUNK LINE DATA, AND STORE IT IN DATABASE |
| PROCESS 3 | READ 1ST AND 2ND POWER TRUNK LINE DATA FROM DATABASE |
| PROCESS 4 | DESIGN LOGICAL BLOCK LAYOUT |
| PROCESS 5 | CREATE 3RD POWER TRUNK LINE DATA |
| PROCESS 6 | DISTRIBUTE LINES BASED ON 1ST-3RD POWER TRUNK LINE DATA |

INTEGRATED CIRCUIT HAVING POWER TRUNK LINE AND METHOD FOR LAYOUT OF POWER TRUNK LINE

This is a continuation application of U.S. patent application Ser. No. 07/647,488, filed on Jan. 29, 1991, now abandoned.

BACKGROUND OF THE INVENTION

1. Field of the Invention

The present invention relates to an integrated circuit, and more particularly to a power trunk line layout design method. The power trunk lines supply power to the integrated circuit at portions where logical functions of the integrated circuit are realized.

2. Description of the Related Art

In the art of integrated circuits, it has been known that a custom-oriented LSI (Large-scale Integrated Circuit), such as a sea-of-gate array and a standard cell, is effective to realize large scale, user definable, logical functions on a chip. The sea-of-gate array and the standard cell comprise one or more blocks arranged on a chip. Each block includes one or more basic cells. Each basic cell is composed of a plurality of transistors and gates.

The sea-of-gate array comprises a multiplicity of basic cells spread over the chip. The individual basic cells are arranged on no wiring areas of on the chip and has no wiring areas (channels) dedicated for wiring, thus providing a channel-free structure. On the contrary, the cell-arranged area and wiring areas (channels) of the standard cell can be designed freely.

With this prior arrangement, partly because the channels were variable and partly because the arrangement of the blocks also was variable, power trunk line design had to be done after the block layout design. Specifically, if the degree of freedom in arranging blocks was increased in attempting to realize a higher-performance logical function, the arrangement of blocks on a chip depended on the logical design and hence could not be standardized. As a consequence, the power trunk lines for supplying power also could not be standardized, and therefore the power trunk lines had to be set based on the arrangement of blocks.

Figure 3:
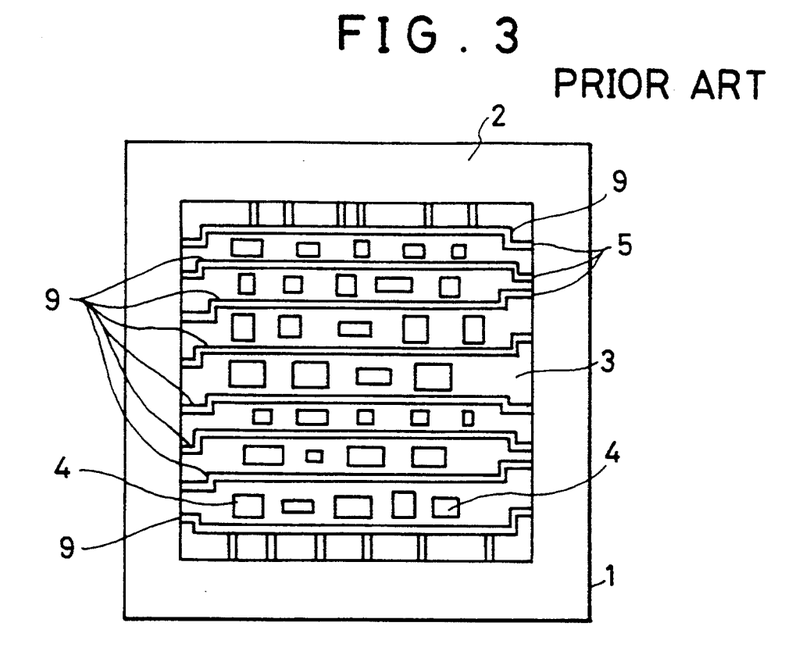
FIG. 3 is a diagram showing the layout of power trunk lines a conventional CMOS sea-of-gate array.

FIG. 3 of the accompanying drawings shows a prior art power supply system for the above-discussed LSI.

The LSI of FIG. 3 comprises an outer logical portion 2 disposed in a peripheral area of a semiconductor chip 1, an inner logical portion 3 disposed in a central area inside the peripheral area, and a plurality of power supply points 5 preliminary and fixedly arranged along the periphery of the inner logical power 3. In the inner logical portion 3, a plurality of blocks 4 are arranged. Transisters and other elements are mounted on the blocks 4.

To supply power to the individual blocks 4, power trunk lines 9 leading from the respective power supply points 5 are arranged directly on the respective blocks 4. Power is supplied from the power supply points 5 via the individual power trunk lines 9.

Heretofore, when designing power supplies of this kind of LSI, particularly the power trunk line layout, it was difficult to retrieve the wiring course of power trunk lines. Namely, when mounting power trunk lines on the target LSI, the block layout is designed, and then lines are provided such that each line extends from a particular fixed power supply point at the periphery of the inner logical portion of one side of the chip to another fixed power supply point at the opposite side of the chip. In this case, however, the arrangement, shape and size of blocks must be considered when designing the line layout. Thus, the resulting power trunk lines would necessarily be curved or bent, as shown in FIG. 3 which makes power trunk line design complex and which requires an additional wiring area or channel so that the logical signal wiring area or channel is reduced. Consequently, logical signal wiring design is difficult.

Further, many power-trunk-line designing data are created for each LSI. The bent power trunk lines require many data designating the coordinates of the bending points as well as many wiring layers to be considered. Thus a complex power-trunk-line designing data results. With LSI, since many power trunk lines are provided, enormous designing data as a whole are required, which makes design laborious and time-consuming.

Conventional power trunk line layout in LSI did not consider either the rate of linearization of power-trunk-line wiring or wiring automation. As a consequence, the wiring course of power trunk lines could not be retrieved without difficulty. Since the resulting wiring had many bends, the rate of linearization was low. Further, since many data were required for designing of each LSI type, standardizing design algorithms, facilitating design and wiring automation could not be achieved.

SUMMARY OF THE INVENTION

A first object of the present invention is to provide an integrated circuit where the course of wiring power trunk lines in the logical function portion of, for example, LSI is easily retrievable and having an improved rate of linearization.

A second object of the present invention is to provide a power trunk line layout method which enables standardizing power trunk line design algorithms, facilitates design and enables wiring automation.

According to a first aspect of the present invention, an integrated circuit comprising: a semiconductor chip having thereon a logical function portion for realizing a logical function; at least one power supply point for supplying electric power to the logical function portion; at least one first, second and third power trunk lines arranged on the chip for supplying electric power from the power supply point to the logical function portion, wherein the second power trunk line is disposed in an area in which the logical function portion of the chip is disposed, the first power trunk line is disposed between the power supply point and the second power trunk line and connecting the second power trunk line with the power supply point, the third trunk line is connected at at least one end to the second trunk line and is disposed in the logical function portion for supplying electric power to the logical function portion is provided.

According to a second aspect of the present invention, a method for arranging the layout of, on a semiconductor chip, power trunk lines for supplying electric power from a power supply point on the chip to a logical function portion having a plurality of blocks for performing logical operations, the method comprising steps of: separating the power trunk lines into one or more second power trunk lines to be disposed along at least a portion outside an area in which the plurality of blocks of the logical function portion are arranged, one or more first power trunk lines for supplying electric power from the power supply point to the second power trunk lines, and one or more third power trunk lines connected to the second power trunk lines for supplying electric power to the logical function portion; first determining the first and second power trunk line layout; then determining layout of the individual blocks of the logical function; and finally determining the third power trunk line layout, based on the arrangement of the second power trunk lines and the arrangement of the logical function portion is provided.

More specifically, a method for power trunk line layout in an integrated circuit, comprising steps of: determining and storing, for each series of the integrated circuit, layout of one or more power supply lines (second power trunk lines) to be disposed in an area in which a logical function portion for realizing a logical function, and layout of one or more power supply lines (first power trunk lines) for supplying electric power from a power supply point on a semiconductor chip to the first-named power supply lines; determining, when newly designing layout of power supply lines for the integrated circuit associated with any series, layout of blocks of a logical function portion for realizing a logical function; then determining layout of power supply lines for supplying electric power to the logical function portion, consulting with the layout data stored for the series; and finally determining layout of power trunk lines of a semiconductor integrated circuit, based on the previously determined layout data and the newly determined layout data is provided.

With such an arrangement, the degree of freedom for block layout design in the logical function portion is scarcely limited, and there is scarcely any influence on the arrangement, shape and size of the blocks since the power supply lines as the second power trunk lines are arranged in a channel (wiring area) along the periphery of the area in which the logical function portion is disposed. Therefore, the position of the power supply lines can be determined, independent of the logical function portions logical design. Consequently, with these power supply lines serving as an interface, the power supply lines are connectable to supply electric power from the power supply point with the power supply lines for supplying electric power into the logical function portion, at respective, arbitrary, positions.

Further, since the starting and ending points of the power trunk lines supplying electric power to the blocks can be determined at respective, arbitrary, positions of the second power trunk lines, power trunk line layout can be determined freely in conformity with the arrangement, shape and size of the blocks, thus facilitating searching of channels.

Still further, since the position of the blocks can be selected such that the power trunk lines are straight, it is possible to improve the rate of linearization. As a result, the bent portions are reduced to minimize the occurrences of unable-to-wire area, thus improving the wiring efficiency.

In addition, since the position of the second power trunk lines can be determined independent of the logical design of the logical function portion, providing a common pattern for each series of integrated circuits is possible. Given that the power trunk lines are partly made common, standardizing the power trunk line design algorithm, facilitating design and wiring automation can be achieved.

Since the third power trunk lines can be arranged in their respective peculiar patterns, the influence on the logical function design portion may be minimized.

From the foregoing, it is possible to sharply reduce the time for designing LSI.

DETAILED DESCRIPTION

Figure 1:
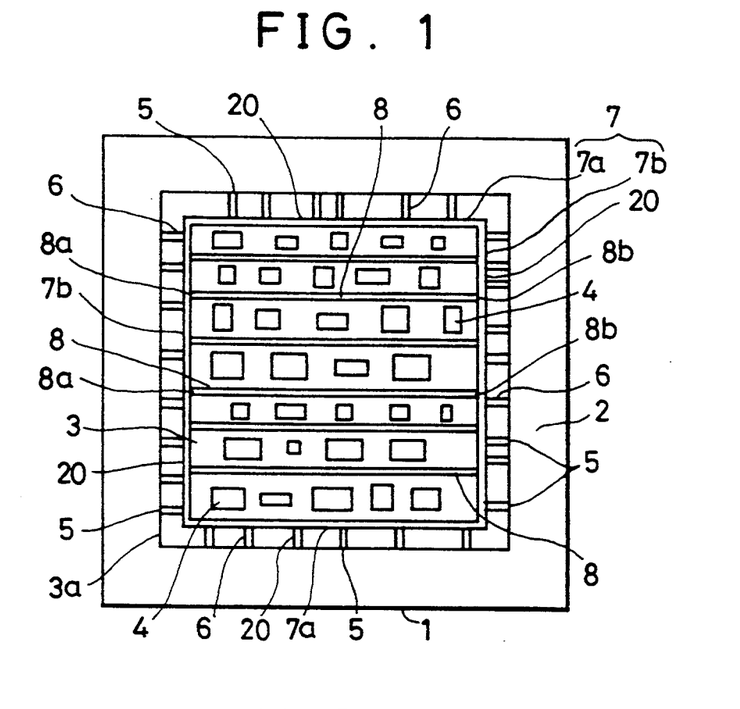
FIG. 1 is a diagram showing a sea-of-gate array embodying the present invention.

The principles of the present invention are particularly applicable in a sea-of-gate array such as shown in FIG. 1.

The sea-of-gate array is in the form of a semiconductor chip 1 comprising an outer logical portion 2 disposed in a peripheral area of a semiconductor substrate such as of silicon, and an inner logical portion 3 disposed in a central area inside the outer logical portion 2. In the outer logical portion 2, circuit elements, such as input and output buffer cells and a bonding pad (all not shown), are adapted to connect with the external portion of the chip 1. A plurality of blocks 4 and power trunk lines are arranged in the inner logical portion 3. This inner logical portion 3 realizes a logical function which a user intends to perform. A plurality of power supply points 5 are arranged on and along the periphery 3a of the inner logical portion 3.

A plurality of basic cells (not shown) each in the form of, for example, CMOS (Complementary Metal Oxide Semiconductor) are spread out over the inner logical portion 3. Each individual block 4, may include one or more basic cells and is optionally located. In general, a plurality of columns of blocks are arranged so that there are a certain number of blocks in each column. The area devoid of blocks 4 is a wiring area (channel) 20.

In the wiring area 20, the power trunk lines for supplying electric power from the power supply points 5 to every block 4 in the inner logical portion 3 and a conducting network composed of signal lines (not shown) connecting the blocks 4, 4 with one another and also connecting each block 4 with the outer logical portion 2 are arranged. The wiring area 20 is ordinarily defined as a channel extending in the transverse direction of the chip 1 and in another direction perpendicular to the transverse direction. The power trunk lines include a line for supplying a source potential and a line for supplying a ground potential.

The power trunk lines include first and second power trunk lines 6, 7 provided before the block layout is designed, and third trunk lines 8 provided after the block layout is designed based on the arrangement, shape and size of the blocks. The power trunk lines are made of a conductive material.

The second power trunk lines 7 are arranged along the periphery of the blocks 4, in a rectangle surrounding the blocks 4 within the inner logical portion 3. Each second power trunk line includes a segment of conductor extending along one side of the rectangle. Each first power trunk line 6 is connected at one end to the second power trunk line 7 and at the other end to the power supply point 5 so that the electrical power is supplied from a power supply point 5 to a second power trunk line 7 via a first power trunk line. The number of the first power trunk lines 6 corresponds to the number of the power supply points 5. In this embodiment, transverse components 7a of the second power trunk line 7 also perform the function of the third power lines.

Further, each of the third power trunk lines 8 is connected at one end to one side of a second power trunk line 7 and at the other end to the opposite side of the second power trunk line 7 for supplying the electrical power to one or more blocks 4 inside. Each of the third power trunk lines 8 is located between adjacent blocks 4, 4, extending in areas devoid of blocks. The third power trunk lines 8 are connected with the individual blocks 4 by means of non-illustrated power supply lines.

A plurality of the power supply points 5 are located on and along the periphery 3a of the inner logical portion 3, namely, in the border of the outer and inner logical portions 2, 3. Each power supply point 5 is connected to a corresponding power supply line (not shown) disposed in the outer logical portion 2.

Figure 5:
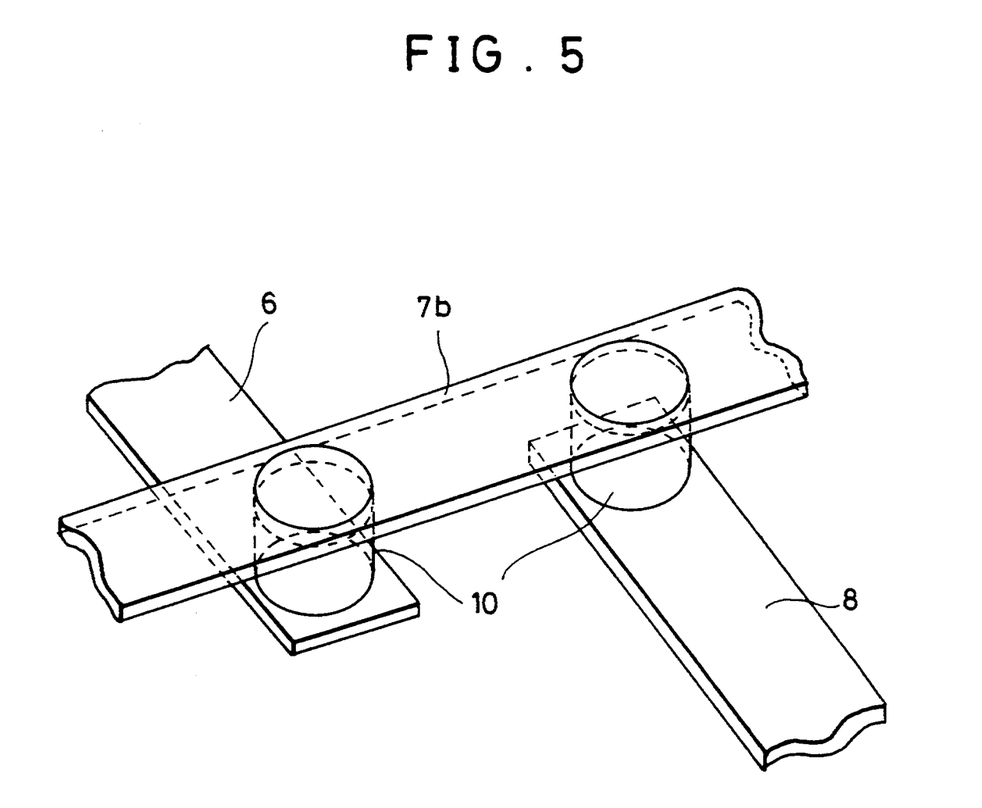
FIG. 5 is a perspective view diagrammatically showing the joint portions between the first and third power trunk lines and between the third and second trunk lines.

In an integrated circuit, some lines extending transversely of the chip and some lines extending perpendicularly to the transverse lines are arranged in two different layers. In this LSI, the first and third power trunk lines 6 and 8, respectively, and the transverse components 7a of the second power trunk line are arranged in one layer, while the perpendicular components 7b of the second power trunk line 7 are arranged in the other layer (over the one layer), as shown in 5. The perpendicular components 7b of the second power trunk line 7 are connected with the first and third power trunk lines 6 and 8, respectively, via through-holes 10. Though there is no illustration in FIG. 5, the transverse components 7a of the second power trunk line 7 are connected with the perpendicular components 7b of the second power trunk line 7 via through-holes as well.

Power trunk line design algorithms will now be described with reference to FIGS. 1 and 2.

Process 1 provides lines perpendicular to the periphery 3a of the inner logical portion 3. Each line extends from a power supply point 5 and serves as a first power trunk line 6.

Process 2 provides, the second power trunk line 7, having line components perpendicular to the first power trunk lines 6. The second power trunk lines 7 connect the terminal points of the first power trunk lines 6 at every side and are interconnected end to end so as to assume a rectangular shape.

The first and second power trunk lines 6, 7 do not restrict the arrangement, shape and size of the blocks 4 and can be provided independent therefrom. Therefore, once designed data are saved in a database and they can be reused as common data for each series of LSIs. Consequently, the work of both Processes 1 and 2 may be done once for every series of LSIs and may be omitted for the same series.

Figure 6:
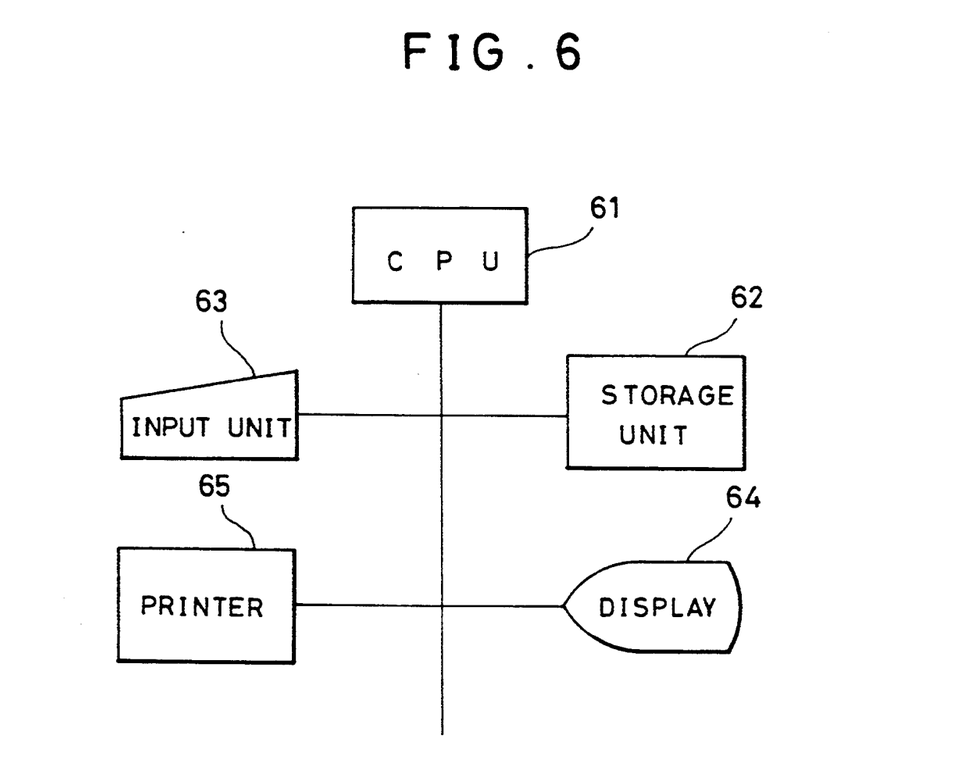
FIG. 6 is a block diagram showing hardware of a database system to be suitably used in designing of layout of an integrated circuit.

As shown in FIG. 6, the database system to be used here comprises, for example, storage unit 62 for storing a program and data which perform database functions, a central processing unit (CPU) 61 for controlling editing, storing and retrieving of data, an input unit 63 for inputting a designation, a command or an instruction to the CPU 61, a display 64 for displaying the retrieved data, and a printer 65 for outputting the data in printed form.

Process 3 reads the saved data from the database in advance so that the data of the first and second power trunk lines 6 and 7, respectively, can be distributed.

Process 4 arranges the individual blocks 4, namely, designing logic block layout. This process can be performed automatically according to previously prepared algorithm.

Process 5 determines the route of each of the individual third power trunk lines 8. The positions of each of the starting points 8a and each of the ending points 8b of the third power trunk lines 8 are determined, depending on the arrangement, shape and size of the blocks 4, so as to be connected with the second power trunk lines 7. In this embodiment, since second power trunk lines 7 are in the form of a continuous loop, it is possible to arbitrarily determine the positions of each of the starting and ending points 8a and 8b, respectively. Therefore, the arrangement of the third power trunk lines 8 can be freely varied, thus facilitating retrieving the wiring route.

Process 6 performs wiring of the power trunk lines according to the data of the first, second and third power trunk lines 6, 7 and 8, respectively. Thus in the LSI chip, the wiring of the power trunk lines are determined. Also, the position of the third power trunk lines 8 as well as the position of the power supply wiring for connection with the individual blocks 4 are automatically determined with reference to layout information concerning the blocks.

Regarding Process 5, in the prior art, it was not easy to automate the retrieval of the routes of the power trunk lines, and therefore, such retrieval was performed manually. In this embodiment, retrieving can be automatically performed by using the data to be supplied form the database system as well as the data for designing the logic block layout.

For example, by locating a hollow channel between blocks based on the data for designing of layout of the logic blocks, the routes of the third power trunk lines may be determined. Also by using the data to be supplied from the database system, the crossing points where the extension of the individual third power trunk lines 8 cross the perpendicular components 7b of the second power trunk line 7 may be ascertained. Thus the position of the third power trunk lines 8 are automatically determined.

The foregoing is done prior to the actual manufacturing of LSI (i.e., a design stage).

Then, according to the previously designed layout, a semiconductor chip on which a plurality of blocks including basic cells are formed by utilizing known semiconductor technology. Wiring is then performed based on the designing information. As mentioned above, the power trunk lines and signal lines extending transversely of the chip 1 and the signal line extending perpendicular to the transverse direction are arranged in two different layers, between which an insulating layer is disposed.

In the resulting LSI, as shown in FIG. 1, the arrangement of the first and second power trunk lines 6 and 7, respectively, can be previously determined, independent of the arrangement of the blocks inside. Also, as mentioned above, designing data can be re-used to minimize the burden of designing other similar LSIs.

Further, in this embodiment, since the positions of the starting and ending points 8a and 8b, respectively, of the third power trunk lines 8 can be determined arbitrarily, the optimum route for wiring may be determined solely by locating the relatively long straight areas between the blocks. Thus the routes of wiring can be determined with ease. Additionally, the individual power trunk lines 8 are straight, thereby improving the rate of linearization and the wiring efficiency. As a result, the influence on distribution of the signal lines may be minimized so that the degree of freedom is increased when arranging the blocks.

The higher the rate of linearization of the power trunk lines, the shorter the length of course or channel. A shorter channel prevents the power voltage from decreasing.

In this embodiment, the second power trunk lines 7 are formed in a rectangle. Alternatively, only the perpendicular components 7b of the rectangle may be the second power trunk lines 7, and the transverse components 7a of the rectangle may be the third power trunk lines 8.

Figure 4:
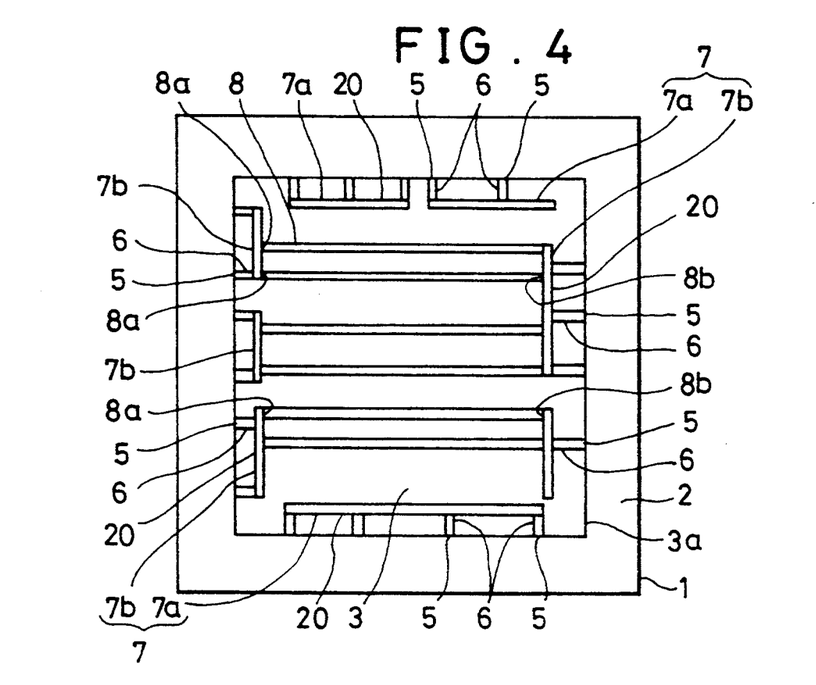
FIG. 4 is a diagram showing a modified sea-of-gate array according to another embodiment of the present invention.

FIG. 4 shows another embodiment of the present invention. In this embodiment, the second trunk lines 7 are discrete. Since the remaining structure is similar to that of the embodiment of FIG. 1, its detailed description is omitted.

Also in this embodiment, like the embodiment of FIG. 1, an outer logical portion 2 and an inner logical portion 3 are formed on a semiconductor chip 1, whereupon the power trunk lines and signal lines are arranged over the outer and inner logical portions 2 and 3, respectively. Although they are not illustrated in FIG. 4, the blocks may be suitably arranged in the inner logical portion 3.

Further, in this embodiment, the second power trunk lines 7 are arranged on and along the periphery of the inner logical portion 3 of the semiconductor chip 1, discretely surrounding the inner logical portion 3. To each of the second power trunk lines 7, individual first power trunk lines 6, whose one end is connected to respective power supply points 5, are connected at the other end. The starting and ending points 8a and 8b, respectively, of the third power trunk lines 8 are connected to the opposite perpendicular components 7b of the second power trunk lines 7.

Figure 2:
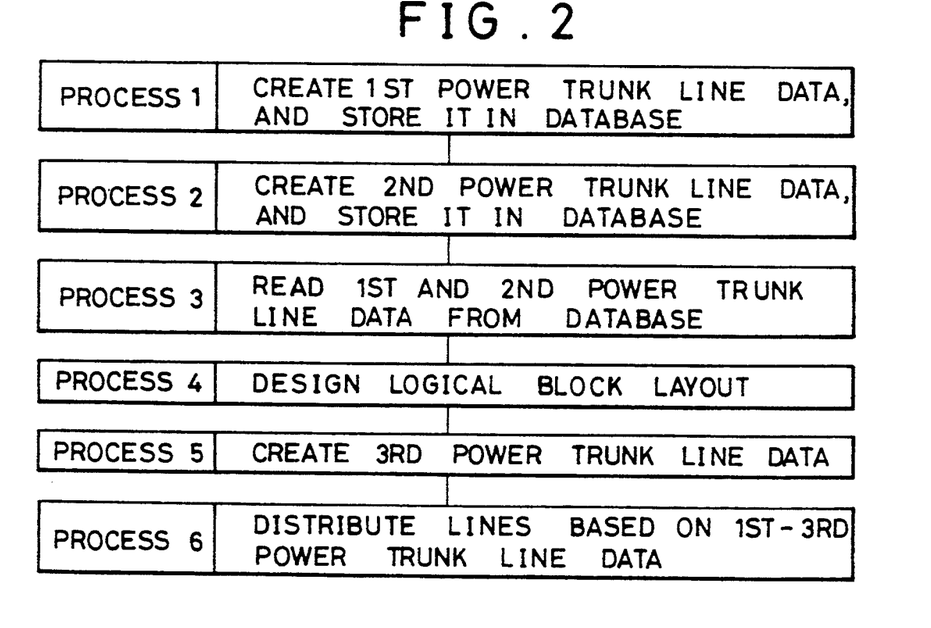
FIG. 2 is a flowchart of the steps in power trunk line design.

Additionally in this embodiment, like the embodiment of FIG. 1, layout of the first and second power trunk lines, layout of blocks and layout of wiring are performed according to the designing steps shown in FIG. 2, whereupon according to this information an integrated circuit is formed on the semiconductor chip.

According to this embodiment, the same advantageous results as in the previous embodiment of FIG. 1 can be obtained. In this embodiment, since the second power trunk lines 7 are arranged discretely, it is particularly convenient when the kind of power source is changed.

Further, in this embodiment, the discrete portions of each side of the second power trunk line 7 are disposed on the same channel. But these discrete portions may be disposed on different channels.

The present invention should not be limited to the foregoing specific forms, and various modifications, for example, following alternative examples may be suggested.

In this embodiment, each of the individual third power trunk lines 8 is connected at opposite ends to the second power trunk lines 7. Alternatively, only one end of each of the third trunk lines 8 may be connected to the second power trunk line 7.

Also in this embodiment, the concept of the present invention is utilized in CMOSLSI (complementary metal-oxide-semiconductor large scale integrated circuit). However, the present invention should by no means be limited to the illustrated specific type and scale of an integrated circuit, and may also be applied to, for example, a bipolar IC (integrated circuit).

Further, in each of the foregoing embodiments, the logical function portion comprises a gate array in which basic cells including a plurality of transistors are spread. Alternatively, the present invention may be also applied to a semiconductor integrated circuit having one or more blocks each including one or more basic cells on a semiconductor chip. These basic cells may be standard cells, in which the cell-arranged area and the wiring area can be designed freely. The individual standard cell may be constructed, for example, as shown in FIG. 1.

Still further, in each of the foregoing embodiments, the second power trunk lines are arranged in a rectangular shape. Alternatively, the second power trunk lines may be arranged in a different shape, for example, in a line corresponding to an external form of an arbitrary figure (not including rectangle) or in parallel.

Moreover, in each of the foregoing embodiments, the type of the integrated circuit is such that the portion where an user can determine the logical function freely is realized by the inner logical portion. However, the present invention may be applied also to an integrated circuit of the type which realizes the logical function, without making a distinction between the inner and outer logical portions.

What is claimed is:

1. A layout method for arranging, on a semiconductor chip, power trunk lines for supplying electric power from a power supply point on the semiconductor chip to a logical function portion having a plurality of blocks for performing logical operations, said method comprising steps of:
    (a) separating said power trunk lines into
        a second-power trunk line disposed along at least a portion outside an area in which said plurality of blocks of said logical function portion are arranged,
        a first power trunk line supplying electric power from said power supply point to said second power trunk line, and
        a third power trunk line connected to said second power trunk line supplying electric power to said logical function portion:
    (b) determining a layout of said first and second power trunk lines;
    (c) determining a layout of the plurality of blocks of said logical function portion; and
    (d) determining a layout of said third power trunk line based on said determined layout of said second power trunk line and the determined layout of the plurality of blocks of said logical function portion.

2. A layout method according to claim 1, wherein said logical function portion is defined in a rectangular area, and said first power trunk line is defined so as to extend from said power supply point to perpendicularly contact the periphery of said logical function portion.

3. A layout method according to claim 1, wherein said power trunk lines include
a plurality of first power trunk lines,
a plurality of second power trunk lines, and
a plurality of third power trunk lines and aid chip includes a plurality of power supply points.

4. A layout method according to claim 3, wherein said second power trunk lines are arranged along at least one pair of parallel sides, respectively, of the periphery of said logical function portion and are connected to said first power trunk lines.

5. A layout method according to claim 4, further comprising steps of: locating gaps between said blocks by consulting with design data defining the layout of said blocks; determining a route from an arbitrary point of one of said parallel pair of second power trunk lines to an arbitrary point of the other second power trunk line; and arranging one of said third power trunk lines so as to follow said route such that said second power trunk lines are connected to a starting point and an ending point of said one third power trunk line, respectively.

6. A layout method for arranging, on a semiconductor chip, power trunk lines for supplying electric power from a power supply point on the chip to a logical function portion having a plurality of blocks for performing logical operations, said method comprising steps of:
(a) separating said power trunk lines into
a second power trunk line disposed in a rectangle in an area in which said logical function portion of the chip is disposed,
a first power trunk line disposed between the power supply point and said second trunk line so as to connect said second power trunk line with said power supply point, and
a third power trunk line, having two ends, disposed in an area in which said logical function portion is disposed, and connected at opposite ends to said second power trunk line supplying electric power to said logical function portion;
(b) determining a layout of said first and second power trunk lines;
(c) determining a layout of the plurality of blocks of said logical function portion; and
(d) determining a layout of said third power trunk line, based on said determined layout of said second power trunk line and an arrangement of said logical function portion.

7. A layout method according to claim 6, wherein said power trunk lines includes a plurality of first power trunk lines, a plurality of second power trunk lines and a plurality of third power trunk lines and the chip includes a plurality of power supply points and wherein said logical function portion is defined in a rectangular area, and said plurality of first power trunk lines are defined so as to extend from said plurality of power supply points to perpendicularly contact a periphery of said logical function portion.

8. A layout method according to claim 7, wherein said plurality of second power trunk lines are arranged along at least one pair of parallel sides, respectively, of the periphery of said logical function portion and are connected to said plurality of first power trunk line.

9. A layout method according to claim 8, further comprising:
locating gaps between said blocks by consulting with design data defining the layout of said blocks; determining a route from an arbitrary point of one of said parallel pair of second power trunk lines to an arbitrary point of the other second power trunk line; and arranging a respective one of said third power trunk lines so as to follow said route such that a respective one of said second power trunk lines is connected to a starting point and an ending point, of the one third power trunk line, respectively.

10. A layout method of power supply lines in the integrated circuit according to claim 6, wherein said first and second power trunk lines have predetermined patters, respectively, each pattern being common to a pattern of a first power trunk line and a patter of a second power trunk line in another integrated circuit of the series to which said integrated circuit belongs.

11. A layout method of power trunk lines in an integrated circuit which includes a semiconductor chip having thereon an outer logical portion including circuit elements for connecting said semiconductor chip with external elements and an inner logical function portion including a plurality of blocks for realizing a logical function, a power supply point for supplying electric power to said inner logical function portion, and power trunk lines for supplying electric power from said power supply point to said inner logical function portion, said outer logical portion being disposed in a peripheral area of said chip and said inner logical function portion being disposed in a central area inside the peripheral area, said method comprising steps of:
(a) separating said power trunk lines into
a second power trunk line disposed in an area wherein said inner logical function portion of said chip is disposed,
a first power trunk line disposed between said power supply point and said second power trunk line so as to connect said second power trunk line with said power supply point, and
a third power trunk line having two ends, disposed in said area wherein said inner logical function portion is disposed, and connected at least one end to said second power trunk line supplying electric power to said inner logical function portion;
(b) determining a layout of said first and second power trunk lines;
(c) determining a layout of the plurality of blocks of said inner logical function portion; and
(d) determining a layout of said third power trunk line, based on said determined layout of said second power trunk line and an arrangement of said logical function portion.

12. A layout method according to claim 11, wherein said logical function portion is defined in a rectangular area, and each of said at least one first power trunk lines is defined so as to extend from said power supply point to perpendicularly contact periphery of said logical function portion.

13. A layout method according to claim 12, wherein said power trunk lines include a plurality of first power trunk lines, a plurality of second power trunk lines and a plurality of third power trunk lines and the chip includes a plurality of supply points and wherein said second power trunk lines are arranged along at least one pair of parallel sides, respectively, of the periphery of said logical function portion and are connected to terminal ends of said first power trunk lines.

14. A layout method of power trunk lines in the integrated circuit according to claim 13, further comprising:

locating gaps between said blocks by consulting with design data defining the layout of said blocks; determining a route from an arbitrary point of one of said parallel pair of second power trunk lines to an arbitrary point of the other second power trunk line; and arranging said third power trunk lines so as to follow said route such that said second power trunk lines are connected to a starting point and an ending point of said third power trunk lines, respectively.

15. A method for designing power trunk line layout in an integrated circuit having a semiconductor chip, a power supply point disposed therein, a logical function portion for realizing a logical function, and a plurality of power trunk lines for supplying electric power from said power supply point to said logical function portion, comprising steps of:

(a) for a plurality of the integrated circuits to which a common layout specification is applied at a portion of the plurality of power trunk lines, preliminarily determining a layout of a first power trunk line for connecting to the power supply point and a second power trunk line for connecting to said first trunk line which are to be arranged outside said logical function portion on a semiconductor chip and storing the determined layout data indicative of the common layout specification for the power trunk lines;

(b) at the time of designing the layout of the power trunk lines for one of said plurality of integrated circuits, determining the layout of said first power trunk line and said second power trunk line using said stored layout data;

(c) determining a layout of a block for realizing the logical function in said logical function portion; and (d) determining a layout of a third power trunk line, which forms a part of the remaining portion of said plurality of power trunk lines, and is connected to said second power trunk line, for supplying electric power to said block, referring to the layouts of said second power trunk line and said block.

* * * * *

UNITED STATES PATENT AND TRADEMARK OFFICE
CERTIFICATE OF CORRECTION

PATENT NO. : 5,391,900
DATED : February 21, 1995
INVENTOR(S) : Yuichi Onodera, et al It is certified that error appears in the above-indentified patent and that said Letters Patent is hereby corrected as shown below:

| Column | Line | |
|---|---|---|
| 1 | 29 | Before "the chip" delete "on". |
| 1 | 53 | Change "power" to --portion--. |
| 1 | 55 | Change "Transisters" to --Transistors--. |
| 6 | 41 | Change "form" to --from--. |
| 6 | 45 | Change "lines" to --lines 8--. |
| 6 | 51 | Change "position" to --positions--. |
| 6 | 55 | After "layout," delete "a". |
| 6 | 56 | Change "chip" to --chips--; delete "on"; after "which" insert --have--; after "blocks" insert --,--. |

UNITED STATES PATENT AND TRADEMARK OFFICE
CERTIFICATE OF CORRECTION

PATENT NO. : 5,391,900
DATED : February 21, 1995
INVENTOR(S) : Yuichi Onodera, et al It is certified that error appears in the above-indentified patent and that said Letters Patent is hereby corrected as shown below:

| Column | Line | |
|---|---|---|
| 6 | 57 | After "cells" insert --,--. |
| 8 | 32 | After "where" change "an" to --a--. |
| 8 | 55 | After "portion" change ":" to --;--. |
| 9 | 5 | Change "aid" to --said--. |
| 10 | 42 | Change "at least" to --at at least--. |

Signed and Sealed this

Eighteenth Day of July, 1995

Attest:

BRUCE LEHMAN

*Attesting Officer*    *Commissioner of Patents and Trademarks*